US010179346B2

(12) United States Patent
Kutej et al.

(10) Patent No.: US 10,179,346 B2
(45) Date of Patent: Jan. 15, 2019

(54) METHOD OF FORMING A TRANSDUCER CONTROLLER AND CIRCUIT THEREFOR

(71) Applicant: SEMICONDUCTOR COMPONENTS INDUSTRIES, LLC, Phoenix, AZ (US)

(72) Inventors: Jiri Kutej, Brno (CZ); Pavel Horsky, Brno (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/284,867

(22) Filed: Oct. 4, 2016

(65) Prior Publication Data
US 2018/0021811 A1 Jan. 25, 2018

Related U.S. Application Data

(60) Provisional application No. 62/244,391, filed on Oct. 21, 2015.

(51) Int. Cl.
| | |
|---|---|
| *B06B 1/02* | (2006.01) |
| *G01S 7/52* | (2006.01) |
| *H01L 41/04* | (2006.01) |
| *H03H 3/04* | (2006.01) |
| *G01S 15/08* | (2006.01) |

(52) U.S. Cl.
CPC ........ *B06B 1/0261* (2013.01); *G01S 7/52004* (2013.01); *H01L 41/042* (2013.01); *G01S 15/08* (2013.01); *G01S 2007/52009* (2013.01); *H03H 2003/0464* (2013.01)

(58) Field of Classification Search
CPC . B06B 1/0261; H01L 41/042; G01S 7/52004; G01S 15/08; G01S 2007/52009; H03H 2003/0464
See application file for complete search history.

(56) References Cited

U.S. PATENT DOCUMENTS

| | | | |
|---|---|---|---|
| 4,122,725 A * | 10/1978 | Thompson | ............ B06B 1/0622 188/268 |
| 5,511,041 A | 4/1996 | Michalski | |
| 7,139,220 B2 * | 11/2006 | Tolciu | ................. G01S 7/52004 367/100 |
| 8,699,299 B2 | 4/2014 | Horsky et al. | |
| 2011/0261652 A1 * | 10/2011 | Horsky | ................. B06B 1/0253 367/97 |

(Continued)

OTHER PUBLICATIONS

Elmos Semiconductor AG, "Ultrasonic Sensor ICs—Temperature Behavior of Transducers," Application Note 0083, QM-No. 25AN0083E.00, Feb. 18, 2013, 4 pages.

*Primary Examiner* — Daniel Pihulic
(74) *Attorney, Agent, or Firm* — Robert F. Hightower

(57) ABSTRACT

In one embodiment, a transducer controller is configured to form a drive signal with a first frequency to drive a transducer. The drive signal has a period and a half-period and drives the transducer for a first portion of the half-period. The transducer controller is configured to, for a second portion of the half-period, sense a voltage formed by the transducer, measure portions of the voltage and estimate a phase error between the first frequency and a resonant frequency of the transducer, and to adjust the first frequency to a second frequency that reduces the phase error.

20 Claims, 12 Drawing Sheets

(56) References Cited

U.S. PATENT DOCUMENTS

2017/0115382 A1* 4/2017 Koudar .................. G01S 7/524
2018/0021811 A1* 1/2018 Kutej ................... B06B 1/0261
367/13

* cited by examiner

METHOD OF FORMING A TRANSDUCER CONTROLLER AND CIRCUIT THEREFOR

PRIORITY CLAIM TO PRIOR PROVISIONAL FILING

This application claims priority to prior filed Provisional Application No. 62/244,391 entitled "METHOD OF FORMING A TRANSDUCER CONTROLLER AND CIRCUIT THEREFOR" filed on Oct. 21, 2015, and having common inventors Kutej et al. which is hereby incorporated herein by reference

BACKGROUND OF THE INVENTION

The present invention relates, in general, to electronics, and more particularly, to semiconductors, structures thereof, and methods of forming semiconductor devices.

In the past, the electronics industry utilized various methods and circuit to form controllers for ultrasonic transducers. In some applications, an ultrasonic transducer may have been used as a portion of a distance measuring system. The distance measuring system could be utilized in vehicles for detecting distances such as providing distance measuring for parking assistance applications. Some of the ultrasonic transducers may have had a narrow frequency band which can be used for transmission of acoustic signals and reception of reflected acoustic signals. Such a frequency may be referred to as the resonant frequency of the transducer or transducer resonant frequency. Typically, the transducer resonant frequency could have been affected by various environmental conditions. For example, the transducer resonant frequency may have been be dependent upon the ambient temperature. Also, rain or ice may form on the transducer and may also have affected the transducer resonant frequency.

Accordingly, it may be advantageous to have a transducer controller that can adjust for changes in transducer 12 resonant frequency.

Figure 1:
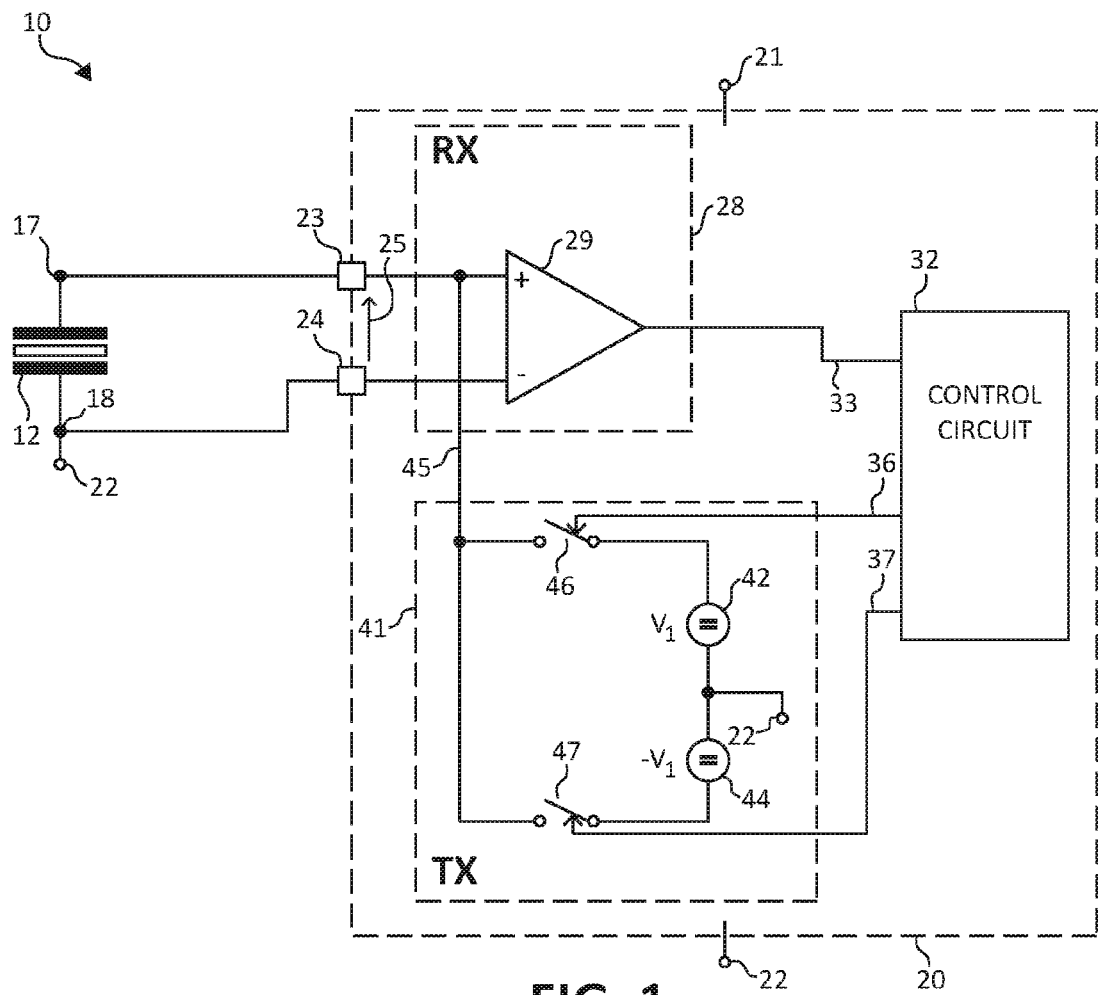
FIG. 1 schematically illustrates an example of an embodiment of a portion of an acoustic measurement system having a piezo-electric transducer in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

The embodiments illustrated and described hereinafter suitable may have embodiments and/or may be practiced in the absence of any element which is not specifically disclosed herein.

DETAILED DESCRIPTION OF THE DRAWINGS

FIG. 1 schematically illustrates an example of an embodiment of a portion of an acoustic measurement system 10 having a piezo-electric transducer (Pz) or acoustic transducer or transducer 12. An embodiment of transducer 12 may have a signal terminal 17 and a second terminal 18. In one embodiment of transducer 12, terminal 17 may be configured to receive a drive signal to excite transducer 12 to vibrate, and may also be configured to form a signal representative of a reflection or of a reverberation. In some embodiments, terminal 18 may be connected to a common reference voltage or alternately may be connected to a receiver to assist in forming signals from transducer 12. System 10 is illustrated using a two terminal transducer. As will be seen further hereinafter, other types of transducers, such as for example a three terminal transducer, may also be used. Additionally, system 10 is sometimes referred to as a transformer-less system because a transformer is not used to couple transducer 12 to a controller or to a driver circuit.

Figure 2:
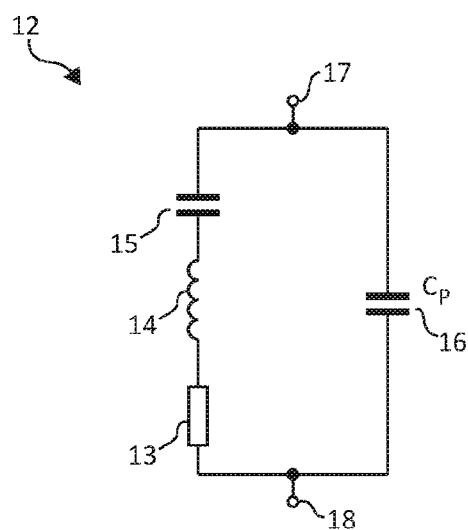
FIG. 2 schematically illustrates an example of an embodiment of a simplified equivalent circuit model of the transducer of FIG. 1 in accordance with the present invention.

FIG. 2 schematically illustrates an example of an embodiment of a simplified equivalent circuit model of transducer 12. In some applications, transducer 12 may be modeled as a series resonant network having a capacitor 15 connected in series with an inductor 14 and in series with a resistor 13 all of which is connected in parallel with a parasitic capacitor (Cp) 16.

Returning back to FIG. 1, system 10 also includes a transducer controller 20 that may be configured to form a drive signal 45 having a frequency and/or phase that is formed responsively to the resonant frequency of transducer 12 including changes of the resonant frequency of transducer 12. As used herein, the phrase "Resonant Frequency" means the resonant frequency of transducer 12 including changes of the resonant frequency of transducer 12.

Controller 20 is configured to receive power for operating controller 20 between a voltage input 21 and a common return 22. In some embodiments, return 22 may be connected to a common voltage such as for example a ground reference voltage or may be connected to a different voltage. System 10 may have an embodiment in which terminal 18 of transducer 12 may be connected to return 22. Controller 20 has input/output terminals 23 and 24 that, in an embodiment, may be configured to receive signals from transducer 12. A receiver circuit or RX or RX circuit 28 of controller 20 may be configured to receive the signals from transducer 12. An embodiment of terminals 23 and 24, or alternately terminal 23, may also be configured to provide a drive signal to transducer 12. A Tx driver circuit or Tx or Tx circuit or drive circuit 41 of controller 20 may be configured to form drive signal 45 to drive or excite transducer 12. In some embodiments, terminal 24 may be omitted. A control circuit 32 of controller 20 may be configured to receive signals from circuit 28, such as for example signal 33, and provide signals, such as for example signals 36-37, to control signal 45 and/or some of the operation of circuit 41. In some embodiments, circuit 32 may be formed to include a non-transitory computer readable medium, such as for example a read only memory or other structure, in which a program to form a method that is described further hereinafter may be stored.

An embodiment of controller 20 may be configured to control transducer 12 to form a measurement cycle in order to measure a distance. Controller 20 may have an embodiment that may be configured to form the measurement cycle to include a driving phase or transmission phase and a subsequent distance measuring phase which may include receiving a signal that is representative of a reflected acoustic signal or echo which may be used to measure a distance. The echo is an echo received from the transmitted acoustic signal formed by the transmission phase. In some embodiments, controller 20 may also include forming the measurement cycle to include an active damping phase after the transmission phase and prior to the distance measuring phase.

The transmission phase may include driving transducer 12 with drive signal 45 having one or more cycles to excite transducer 12 to form the transmitted acoustic signal used to measure distance. The value of drive signal 45 may vary during a cycle. A cycle of drive signal 45 may include a first period or drive period to form the transmitted acoustic signal. As will be seen further hereinafter, an embodiment of controller 20 may be configured to determine a that a difference exists between the Resonant Frequency and the frequency of signal 45 and to change the frequency of signal 45 in response to the difference. The existence of a difference between the Resonant Frequency and the frequency of signal 45 is referred to herein as the "Frequency Difference". Also, as used herein the frequency of signal 45 used to transmit an acoustic signal for measuring a distance including any changes to that frequency is referred to as the "Drive Frequency". Determining the Frequency Difference and adjusting the Drive Frequency to be substantially equal to the Resonant Frequency facilitates configuring controller 20 to improve the sensitivity and accuracy of the measurements and, in some embodiments, may increase the distance at which objects may be detected.

Figure 3:
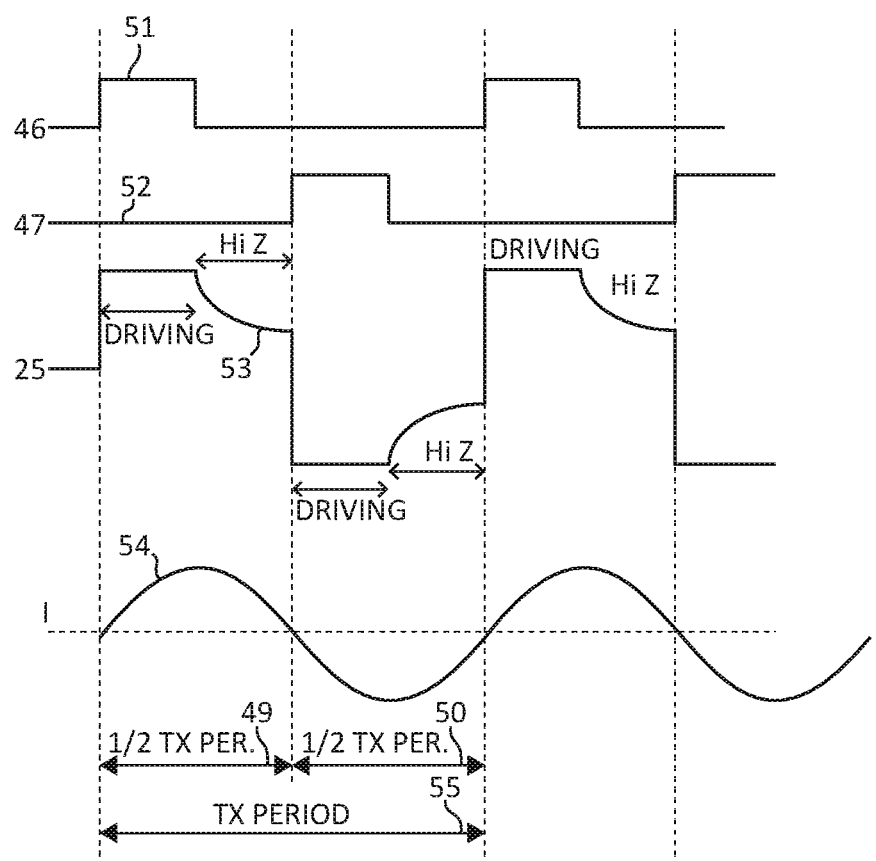
FIG. 3 is a graph illustrating an embodiment of an example of some signals formed as a result of the operation of the controller of FIG. 1 in accordance with the present invention.

FIG. 3 is a graph illustrating an embodiment of an example of some signals formed as a result of controller 20 driving transducer 12 as a portion of the transmission phase used to measure a distance. The plots of FIG. 3 illustrate a non-limiting example embodiment of some conditions of an example of an embodiment of a method of controlling transducer 12 wherein that method may be performed by controller 20. A plot 51 illustrates states of switch 46, and a plot 52 illustrates states of switch 47. A plot 53 illustrates a voltage 25 formed across transducer 12. A plot 54 illustrates the circulating current flowing within transducer 12. This description has references to FIG. 1 and FIG. 3.

In one example embodiment of a method of controlling transducer 12, controller 20 may be configured to form drive signal 45 to have the Drive Frequency and a corresponding drive period 55 labeled in FIG. 3 as a "Tx period". Drive period 55 includes two half-periods 49 and 50 labeled as "½ Tx per". In an embodiment, controller 20 may be configured to apply signal 45 with one polarity during one half-period of drive period 55 and to apply signal 45 with an opposite polarity during a sequential half-period of drive period 55. An embodiment of controller 20 may be configured to form a method of controlling transducer 12 that includes forming signal 45 to drive transducer 12 to create a transmitted acoustic wave for the transmission phase to measure a distance. Signal 45 may induce a circulating current within transducer 12 which may form a reverberation signal between terminals 17 and 18 of transducer 12. The frequency and phase of the reverberation signal depends on the phase and frequency of the oscillations of transducer 12, for example oscillations resulting from the circulating current which can be regarded as circulating inside of the resonant circuit of transducer 12. The circulating current in transducer 12 may form a voltage between terminals 17 and 18. In an embodiment the voltage formed by the circulating current may be an integration of the circulating current of transducer 12. Thus, the reverberation signal may be a voltage or a current. The reverberation signal can be received by controller 20 and controller 20 may be configured to detect the Frequency Difference. For example, circuit 28 may receive the reverberation signal as a voltage and circuit 32 may be configured to detect the Frequency Difference. In other embodiments, controller 20 may be configured to use a signal that is representative of the current. The phase and frequency of the reverberation signal may be representative of the phase and frequency of the Resonant Frequency.

An embodiment of controller 20 may be configured to apply signal 45 for a portion or percentage of a half-period of signal 45, such as for example one or more of half-periods 49 or 50. Controller 20 may include an embodiment that may be configured to detect the Frequency Difference in at least a portion of the remainder of the half-period. During a first half-period, such as for example half-period 49, switch 46 may be enabled or closed and switch 47 may be open or disabled to apply signal 45 to transducer 12 during a portion or percentage of the half-period. For example, during the portion labeled as Driving in plot 52. During another portion or another percentage of that same half-period or alternately the remainder of the half-period, circuit 41 may be controlled to not drive transducer 12. For example, the portion labeled as HiZ in plot 53. In some embodiments, the output of circuit 41 may be placed in a high impedance state. For example, both of switches 46 and 47 may be open or disabled and controller 20 may form a high output impedance on or alternately between terminals 23 and 24. In some embodiments, the high impedance may be a value in excess of one meg-ohm. The portion of the drive half-period during which the output of circuit 41 is not driving transducer 12 and controller 20 has the high impedance may be referred to herein as a "HiZ interval". An embodiment may include that controller 20 may also be configured to form the HiZ interval at other places in signal 45. For example, controller 20 may be configured to form the HiZ interval only once within a drive period or may be configured to form the HiZ interval at other places within a half-period, such as for example at approximately the beginning of or alternately near the middle of the half-period or middle of the drive period, instead of at the end of the half-period. Controller 20 may be configured to monitor the reverberation signal formed by the reverberation or resonant oscillation of transducer 12 for at least a portion of the HiZ interval and controller 20 or alternately circuit 32 may be configured to detect the Frequency Difference. During a second drive half-period, such as for example half-period 50, switch 47 (FIG. 1) may be enabled or closed and switch 46 may be open or disabled to apply signal 45 with an opposite polarity to transducer 12 during a portion or percentage of the second drive half-period. During another portion of that same second drive half-period or alternately the remainder of the second drive half-period, circuit 41 may again be placed in a state to not drive transducer 12 to form a HiZ interval, or alternately placed in the high impedance state, and controller 20 or alternately circuit 32 may again determine the Frequency Difference. In some embodiments, controller 20, or alternately circuit 32, may be configured to detect the Frequency Difference of only one of the half-periods 49 or 50. Controller 20 may be configured to detect the Frequency Difference from the received reverberation signal during the first half-period and then adjust the Drive Frequency to be closer to the Resonant Frequency and/or detect the Frequency Difference from the received reverberation signal during the second half-period and then adjust the Drive Frequency to be closer to the Resonant Frequency.

Controller 20 may be configured to repeat drive period 55 for a certain number of cycles before completing the transmission phase of the measurement cycle. Those skilled in the art will appreciate that in some embodiments, it may be necessary to drive transducer 12 for a small number of cycles before transducer 12 has stored enough energy to reverberate, thus before beginning to form a series of drive periods 55.

FIG. 4 includes graphs illustrating non-limiting examples of embodiments of the phase of signal 45 and the phase of the reverberation signal for different drive signal frequencies for an example embodiment of a Resonant Frequency. Plots 56 illustrate signal 25 and plots 57 illustrate the circulating current in transducer 12. The abscissa indicates time and the ordinate indicates increasing value of the illustrated signals. The abscissa is normalized such that the time interval of the cycle is illustrated to be one hundred percent of the period.

Figure 4A:
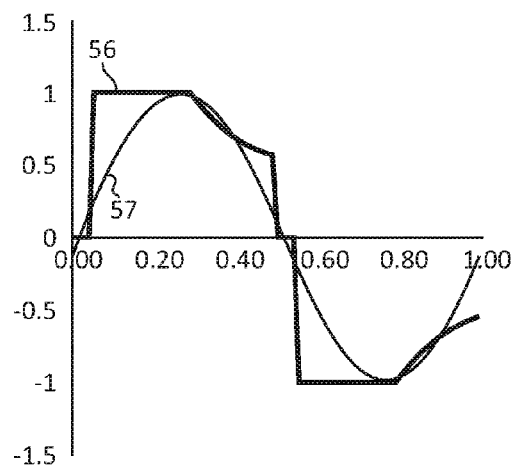
FIGS. 4A-4C include graphs illustrating non-limiting examples of embodiments of some of the signals formed during the operation of an embodiment of the controller of FIG. 1 in accordance with the present invention.

The graphs in FIG. 4A illustrates an example where the Drive Frequency is substantially equal to the Resonant Frequency. As illustrated, the phase shift between the two signals is substantially zero.

Figure 4B:
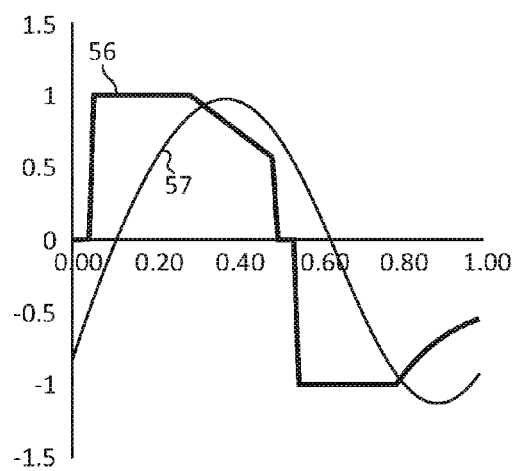

The graphs in FIG. 4B illustrates an example where the Drive Frequency is greater than the Resonant Frequency. Because the Drive Frequency is greater than the Resonant Frequency, the circulating current lags signal 45. This is referenced as a positive phase shift or positive phase error because the current signal occurs after signal 45. The illustrated example shows a positive phase error of approximately forty degrees (40°).

Figure 4C:
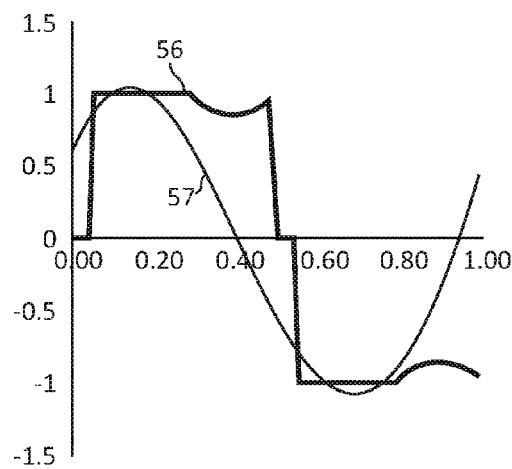

The graph in FIG. 4C illustrates an example where the Drive Frequency is lower than the Resonant Frequency. Because the Drive Frequency is lower than the Resonant Frequency, the current signal leads signal 45 which results in a negative phase shift or negative phase error. The example illustrated in FIG. 4C illustrates a negative phase error of approximately forty degrees (−40°).

In an embodiment, controller 20 may be configured to estimate a phase difference between the circulating current and signal 45, thus, the phase error. Controller 20 may be configured to then use the phase error to estimate which direction (increase or decrease) to adjust the Drive Frequency to be closer to the Resonant Frequency. An embodiment may include that controller 20 may be configured to adjust the Drive Frequency to be substantially equal to the Resonant Frequency or alternately closer to the Resonant Frequency. In some embodiments, it may take more than one cycle 55 to adjust the Drive Frequency to be substantially equal to the Resonant Frequency.

An embodiment may include that controller 20 may be configured to calculate or determine or estimate the phase error between signal 45 and the circulating current for every half-period of signal 45 or may be configured to calculate or determine or estimate the phase error for only some of the drive periods or alternately some of the half-periods of signal 45. Controller 20, or alternately circuit 32, may have an embodiment that may be configured to receive the reverberation signal of transducer 12 for at least a portion of a HiZ interval. An embodiment of circuit 32 may also be configured to calculate or determine or estimate the phase error for at least a portion of one or more HiZ intervals.

Figure 5:
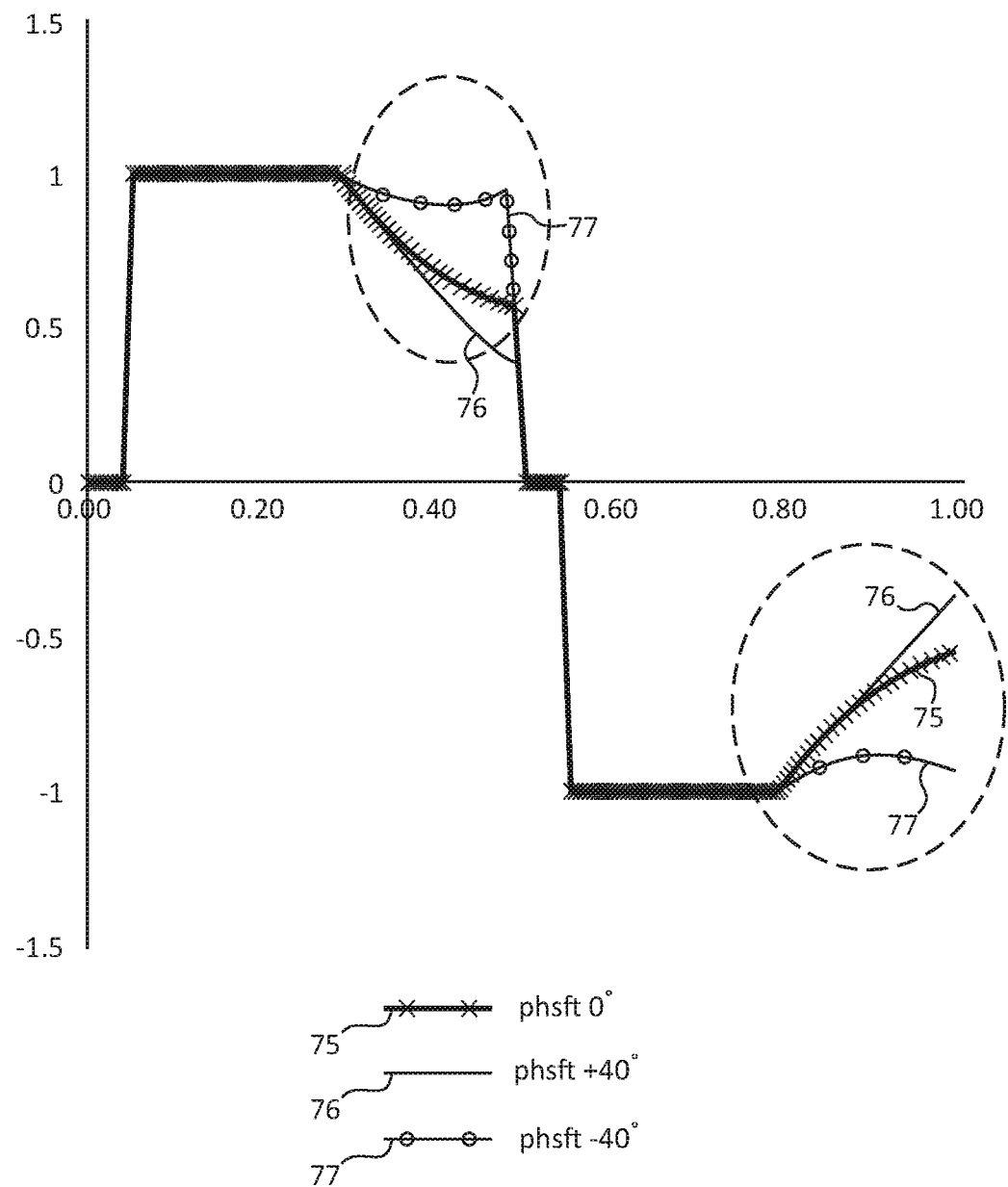
FIG. 5 is a graph illustrating non-limiting examples of embodiments of some of the signals formed during the operation of an embodiment of the controller of FIG. 1 in accordance with the present invention.

FIG. 5 is a graph illustrating a non-limiting example of some of the signals formed during the operation of an embodiment of controller 20. Plots 75-77 illustrate voltage 25 for three (3) different frequencies of signal 45 and the corresponding phase error for each is identified. Plot 75 illustrates an embodiment of signal 45 having a Drive Frequency that is been substantially matched to the Resonant Frequency. Plots 76 and 77 illustrate an embodiment of signal 45 having a Drive Frequency that is respectively higher than or lower than the Resonant Frequency. The abscissa indicates time and the ordinate indicates increasing value of the illustrated signals. Those skilled in the art will appreciate that for the portion of the drive period or half-period that controller 20 is driving transducer 12, voltage 25 is representative of driving signal 45, and that for the HiZ interval or portion of the drive period or half-period, voltage 25 is representative of the reverberation signal. In plots 75-77, the HiZ intervals are identified in a general manner by dashed circles.

Figure 6:
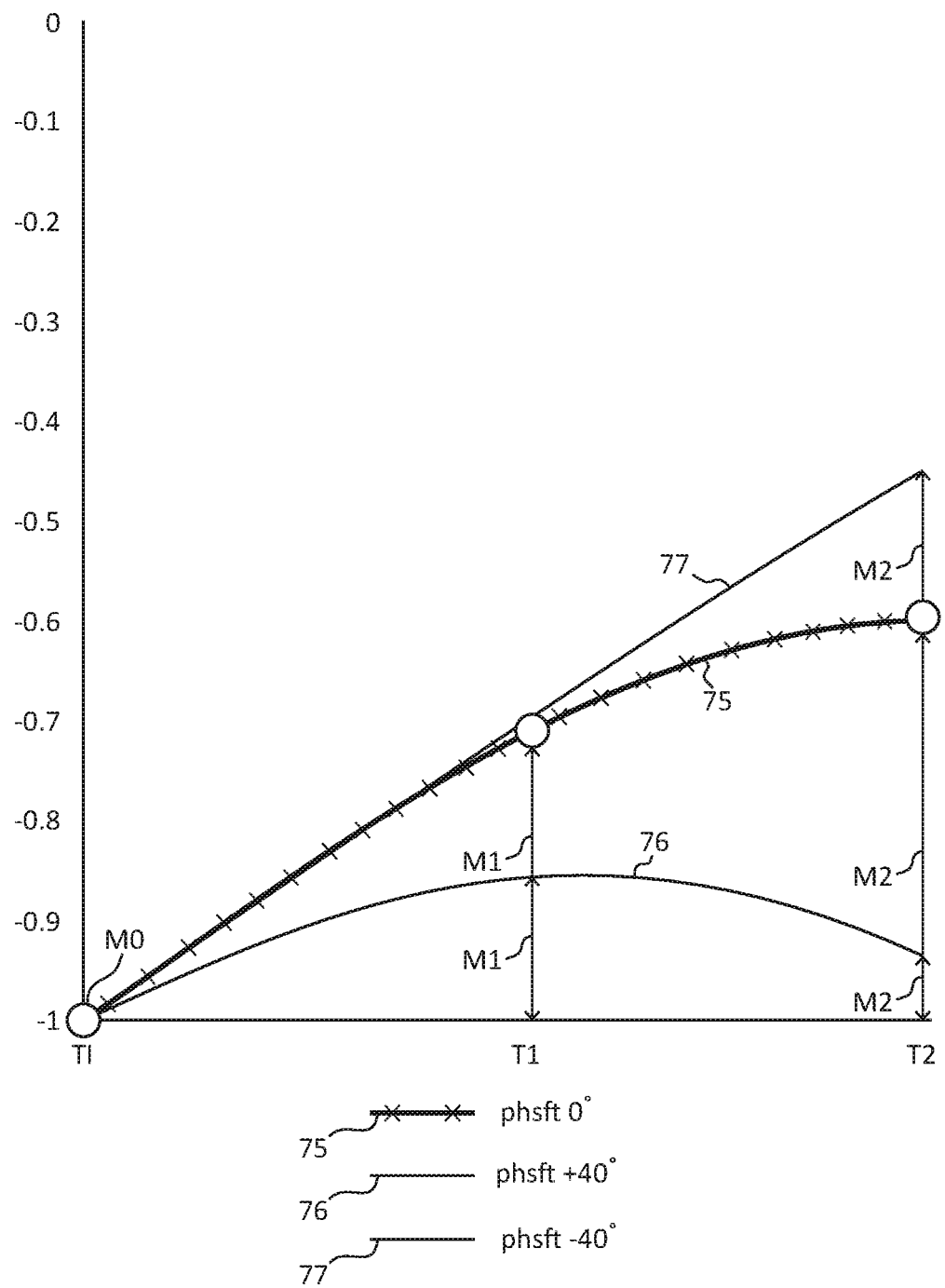
FIG. 6 is a graph illustrating a non-limiting example of an embodiment of an enlarged view of portions of the graph of FIG. 5 in accordance with the present invention.

FIG. 6 is a graph illustrating a non-limiting example of an embodiment of an enlarged view of the portion of FIG. 5 that is highlighted by one of the dashed circles of FIG. 5. One example embodiment of a method to detect the Frequency Difference and/or estimate the phase error may be to measure or estimate the curvature of the reverberation signal as representative of the phase error between signal 45 and the circulating current within transducer 12. The phase error can be used to detect the Frequency Difference in addition to the amount of the difference between the two frequencies. This description has references to FIGS. 5-7.

A method of detecting the Frequency Difference may include estimating the curvature of the reverberation signal, such as for example during a portion of the HiZ interval. In an embodiment, the method may also be used to estimate the phase error. For example, measuring a value of the reverberation signal at different points within the HiZ interval. The time interval between the different points and the amplitude of the signal can be used to determine or estimate or calculate the phase error. Controller 20 may be configured to calculate a shape of the waveform of the signal which may indicate the phase error between the Drive Frequency and the Resonant Frequency. For example, the phase error between signal 45 and the circulating current.

In an example embodiment, controller 20 may be configured to calculate or estimate a shape of a portion of the waveform of the reverberation voltage, such as for example voltage 25, and use the estimated shape to estimate the phase error. Controller 20 may be configured to determine a ratio (R) between the value of the reverberation signal different time points of the HiZ interval. In one example embodiment, three different point may be used. The method may include measuring the first point as the value of the reverberation signal at or near the time that the output of controller 20 goes to the high impedance state and then measure the value of the reverberation signal at two additional points during the HiZ interval. For example, the first time point or initial time point may be illustrated by a time TI at which the value of the signal may be a value M0. Examples of embodiments of two additional points are indicated illustrated in FIG. 6 as the value M1 at a time T1 and the value of the signal at a different time point such as for example the time T2 as the value M2. Values M1 and M2 are illustrated in a general manner for each embodiment of the signal by arrows. The values for M0 for each of plots 75-77 may be substantially similar since they occur at or near the initial point TI. The values of M1 and M2 for each plot 75-77 are different because each plot represents a different phase error, thus, has a different portion of the curve at points T1 and T2. In one example embodiment, the first point of the two additional points may be measured approximately near or at the middle of the HiZ interval and the second point of the two additional points may be measured at or approximately near or at least before the end of the HiZ interval. An embodiment may include measuring the two additional points spread evenly over the HiZ interval between the first measurement point and approximately near or approximately at the end of the HiZ interval. The amplitude of the signal at the three points is illustrated as corresponding amplitudes M0-M2. A ratio (R) between the measured values may be calculated as:

$$R=ABS(V2/V1).$$

In an embodiment, the ratio R may be also calculated as, $$R=ABS[(M2-M0)/(M1-M0)]$$

where,
ABS=Absolute value,
V1=M1−M0,
V2=M2−M0,
M0=the amplitude at the initial point TI, and
M1, M2=the amplitude at corresponding points T1, T2.

The ratio R may be used as indication of the curvature of the measured reverberation signal. In one embodiment the value M0-M1 may be representative of a change in value over a time interval and the value M0-M2 may be representative of a change in value over a different time interval, thus the ratio between these two can be representative of the curvature of the waveshape of the measured signal. The curvature may be an indication of the magnitude of the phase error and the sign of the phase error may be an indication of the direction (plus or minus) of the phase error, such as the direction indicated by the signs in the legend of FIG. 6. For example, if the measurements indicate that the value of the signal is going positive the phase error may be negative and the Drive Frequency may need to be increased, or if the value of the signal is going negative the phase error may be positive and the Drive Frequency may need to be decreased, or if the value of the signal is going staying close to zero the phase error may be substantially zero and the Drive Frequency may need to stay substantially constant.

There may be embodiments where there may be a preferred value of R. The preferred value of the ratio (R) usually is theoretically calculated. It may be dependent on the exact timing of the voltage (M0-M2), the position of the measurement points (TI-T2), and duration of the HiZ interval as a portion of the complete drive period. In some embodiments, the value of the ratio (R) can be used to estimate the phase error.

In one example embodiment, the theoretically calculated preferred value of the ratio (R) for the illustrated example embodiment of the three measurement points of FIG. 6 was approximately 1.618. If the value of R determined by controller 20 was greater than 1.618, the phase error may be positive and the Drive Frequency may need to be decreased. Conversely, if the value determined by controller 20 is lower than 1.618 the phase error may be negative and the Drive Frequency may need to be increased. In some embodiments, the amount that the ratio (R) deviates from the theoretical value may be an indication of the magnitude of the phase error and also of difference between the Drive Frequency and the Resonant Frequency. Thus, the ratio value may indicate an amount that the Drive Frequency needs to change and the direction of the change (increase or decrease). In some embodiments, decreasing the Drive Frequency may include delaying slightly the next half-cycle of signal 45 and increasing the frequency may include reducing the width or time of the next half-period.

Figure 7:
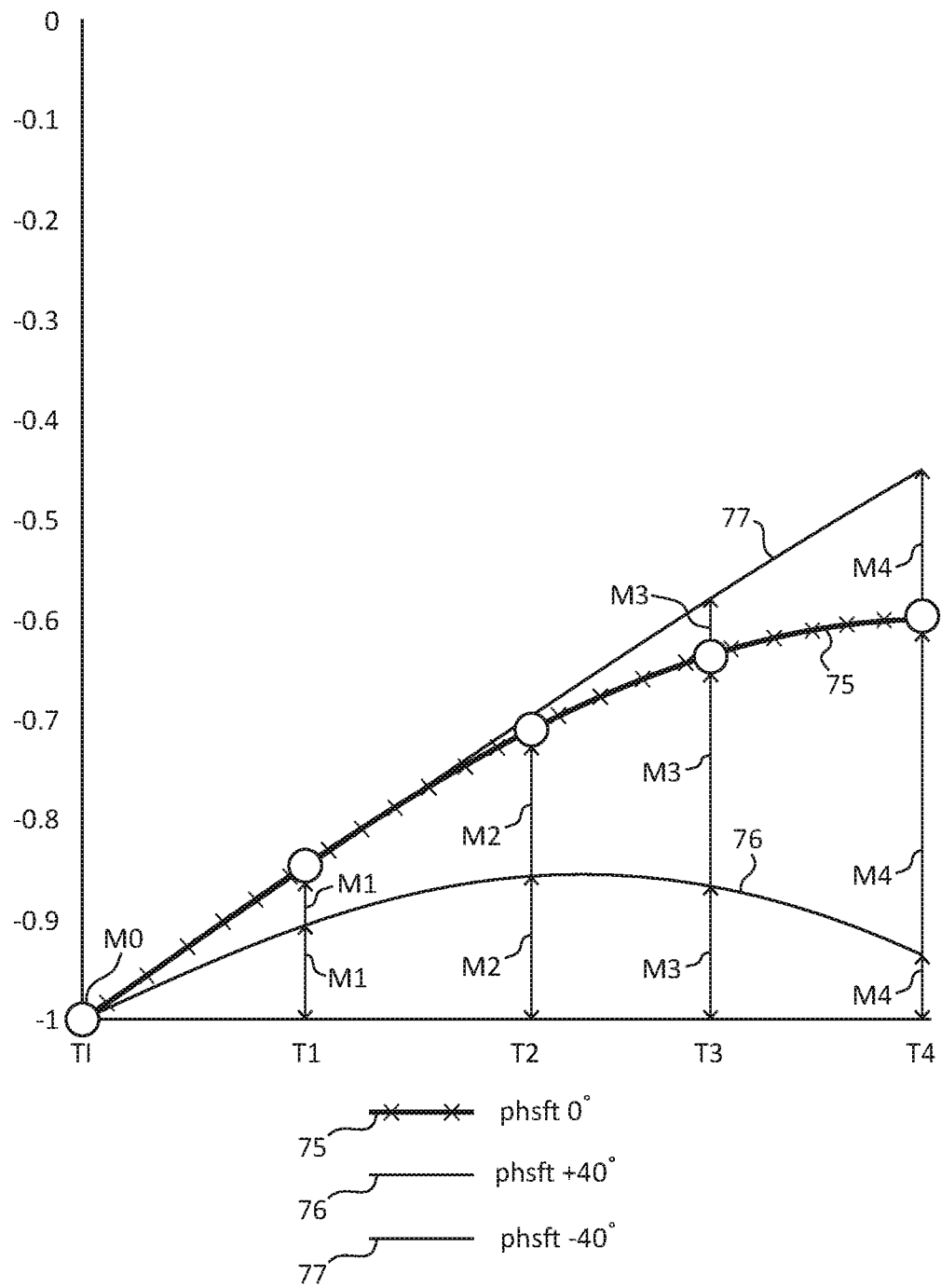
FIG. 7 is a graph illustrating another non-limiting example of an embodiment of an enlarged view of portions of the graph of FIG. 5 in accordance with the present invention.

FIG. 7 is a graph illustrating another non-limiting example of an embodiment of an enlarged view of a portion of FIG. 5 that is highlighted by one of the dashed circles of FIG. 5. The phase shift and/or curvature of the waveform of the signal may be estimated by measuring the signal value at more points of the HiZ interval. For example, FIG. 7 illustrates a method using five (5) different points during the HiZ interval. In one example embodiment, the curvature of the signal may be determined from the values of the five (5) measurement points.

The method may include measuring the value of the reverberation signal at or near the time that the output of the driver goes to the high impedance state, for example at or near the start of the HiZ interval, and then measuring the value of the reverberation signal at four additional other points during the HiZ interval. An example embodiment of a method of determining the phase error may include sampling the reverberation signal at five different time points during the HiZ interval.

The method may include measuring the first point as the value of the reverberation signal at or near the time that the output of the driver goes to the HiZ state and then measure the value of the reverberation signal at four additional points during the HiZ interval. For example, the first time point or initial time point may be illustrated by a time TI at which the value of the signal may be a value M0. An embodiment may include measuring the four additional points spread evenly over the HiZ interval between the first measurement point and approximately near or at the end of the HiZ interval. The amplitude of the signal at the five points (TI-T4) is illustrated as corresponding amplitudes M0-M4. Examples of embodiments of four additional points are indicated illustrated in FIG. 7 as the value M1 at a time T1, the value M2 at a time T2, the value M3 at a time T3, and the value M4 at a time T4. Values M1-M4 are illustrated in a general manner by arrows. A ratio (R) between the measured values may be calculated as:

$$R=ABS[(V4+V3)/(V2+V1)].$$

In an embodiment, the ratio R may be also calculated as:

$$R=ABS[(M4+M3-2*M0)/(M2+M1-2*M0)]$$

where,
ABS=Absolute value of,
V1=M1−M0,
V2=M2−M0,
V3=M3−M0,
V4=M4−M0,
M0=the amplitude at the initial point, and
M1, M2, M3, M4=the amplitude at corresponding points T1, T2, T3, T4.

It is believed that, in some embodiments, measuring the amplitude of the signal at four or more points during the HiZ interval may provide more accurate calculation of the phase error and/or the curvature of the signal. Using the four or more points may also may assist in measuring other parameters of transducer 12 such as for example the parallel capacitance or the serial impedance of transducer 12.

Controller 20 may be configured to form a method for detecting the Frequency Difference. An embodiment of the method may include driving transducer 12 during the driving phase with a fixed transmission frequency for a first number of drive periods to form the circulating current in transducer 12 and without detecting the Frequency Difference. In some embodiments, the method may include that for the first number of driving periods signal 45 may be applied for the entire drive half-period or optionally may be only applied for the portion of the drive half-period with the other portion being the HiZ interval. In some embodiments the method may include that the first number may be in the range of approximately three to five (3-5) or approximately two to five or more (2-5+) cycles.

After the first number of drive periods, controller 20 may be configured to form the method to control signal 45 to include the HiZ interval, detect the Frequency Difference or alternately estimate the phase error, and adjust the Drive Frequency to be substantially equal to the Reverberation Frequency. During the a portion of the drive half-period, signal 45 may be driving transducer 12 to form the transmitted acoustic signal and during the HiZ interval controller 20 may be configured to determine or estimate the phase error or may be configured to estimate the curvature of the waveform of the signal. Controller 20 may include an embodiment configured to adjust the frequency of the next drive signal to reduce the phase error or alternately to form the phase error to be substantially zero. An embodiment may include controller 20 may be configured to adjust the frequency of the next drive signal to be approximately equal to the Resonant Frequency. Controller 20 may have an embodiment configured to adjust the Drive Frequency to reduce the phase error in one step, such as for example during one HiZ interval, or to adjust the drive frequency in smaller steps over a number of drive signal periods or half-periods. In some embodiments controller 20 may be configured to form the first adjustment of the Drive Frequency to be a larger percentage of the Frequency Difference and use smaller drive frequency changes for subsequent cycles of signal 45.

Figure 8:
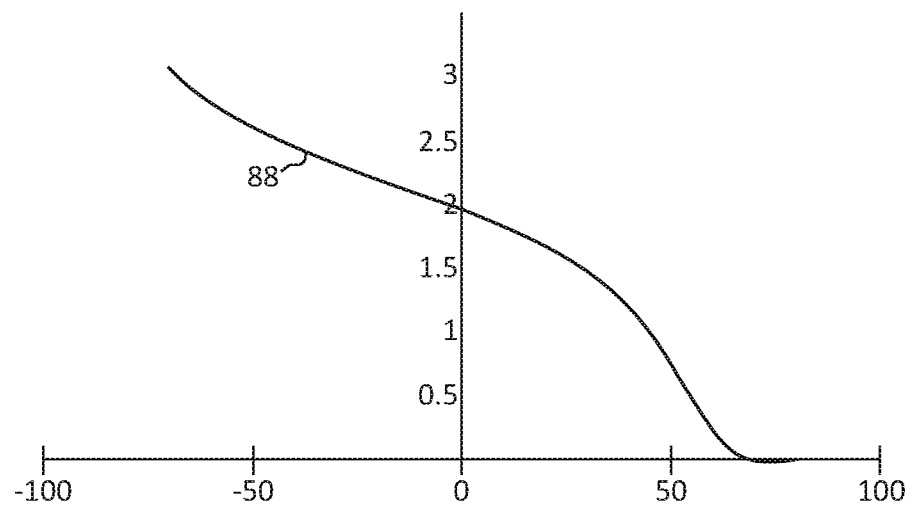
FIG. 8 is a graph illustrating a non-limiting example of an embodiment of a dependency between the phase error and the calculated ratio (R) in accordance with the present invention.

FIG. 8 is a graph illustrating a non-limiting example of embodiment of a dependency between the phase error and the calculated ratio (R). The ratio R may be used as indication of the curvature of the measured reverberation signal or alternately as an indication of the phase error. There may be embodiments where there is a preferred value of R. The preferred value of the ratio (R) usually is theoretically calculated. It may be dependent on the exact timing of the voltage measurement points (M0 to M4) and the duration of the HiZ interval as a portion of the complete drive period or alternately of the half-period.

In one example embodiment, such as for example the example embodiment described relating to FIG. 8, the theoretically calculated preferred value of the ratio (R) was approximately 1.963. If the value of R measured or determined by controller 20 was greater than 1.963, the Drive Frequency may need to be decreased. Conversely, if the value measured or determined by controller 20 is lower than 1.963, the Drive Frequency may be increased. The theoretically calculated preferred value of the ratio (R) for the example of FIG. 7 may be different than the theoretically calculated preferred value calculated for the example embodiment of FIG. 6 because the theoretically calculated preferred value depends on the number of points, the distance between them, the position of the points, and, in some embodiments, the formula that is used.

Figure 9:
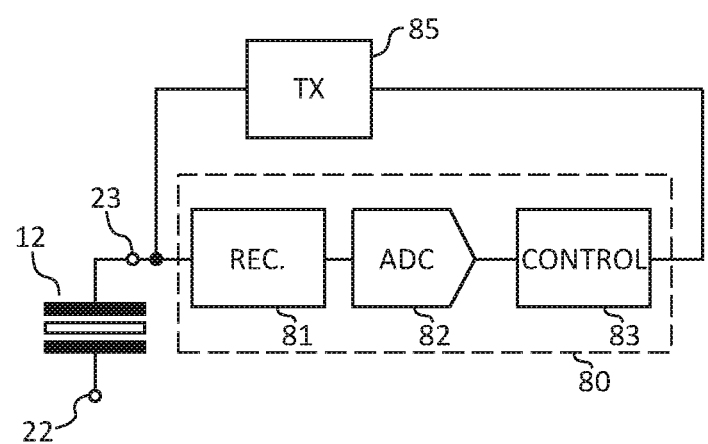
FIG. 9 schematically illustrates a portion of an example of an embodiment of a circuit that may be a portion of the circuit of FIG. 1 in accordance with the present invention.

FIG. 9 schematically illustrates a non-limiting example of an embodiment of a circuit 80 that may be utilized to measure the reverberation signal during the HiZ interval or alternately to detect the Frequency Difference or alternately to determine the curvature of the reverberation signal or alternately to estimate or determine the phase error. Circuit 80 may also be configured to adjust the Drive Frequency to be substantially equal to or alternately closer to the Reverberation Frequency. Circuit 80 may include a receiver or Rec or receiver circuit 81, an analog-to-digital conversion circuit (ADC) 82, and a control circuit 83. In some embodiments, circuit 81 may include circuit 28 or a portion thereof, such as for example input amplifier 29, and may be used to receive the reverberation signal during the HiZ interval and form a signal that is representative of the reverberation signal. Circuit 81 may have an embodiment that includes an attenuator to adjust the received or amplified signal to a usable value. The attenuator may be omitted in some embodiments.

In some embodiments circuit 83 may include a digital signal processor and other processors or circuits. Circuit 83 may have an embodiment that may include circuit 82. Circuit 83 may be configured to determine parameters such as the HiZ time interval, the amplitude of the reverberation signal at the measurement points, may be configured to form signal 45 to form the HiZ interval, and may be configured to process the information in an algorithm to detect the Frequency Difference, and/or to determine the phase error, to adjust the Drive Frequency to be substantially the Resonant Frequency, and/or to estimate the curvature of the reverberation signal. In an embodiment, circuit 80 may be a portion of circuit 32 (FIG. 1).

In one embodiment, circuit 32 (FIG. 1) and or circuit 80 may be configured to form a method to determine the curvature of the reverberation signal that forms the information in the measurement points, determine the ratios for the points of the reverberation signal, and to adjust the Drive Frequency to be substantially the Resonant Frequency. For example, an embodiment may include that circuit 32 (FIG. 1) or circuit 80 may be configured to integrate the received reverberation signal and/or interpolate from the measurement points to determine the amplitude, frequency, and phase error of the circulating current.

Those skilled in the art will appreciate that the method of measuring the value of the received signal at various points of the HiZ interval and determine the ratio (R) is merely a vehicle to explain one example method of estimating the phase error or alternately the curvature of the signal and of determining how to change the Drive Frequency. Those skilled in the art will appreciate that other methods may also be used. For example, the controller may be configured to count time intervals between the start of the HiZ interval and the signal crossing a threshold value. The amount of time it takes for the signal to cross the threshold value is an indication of the phase error. A long time interval may indicate a large negative phase error and a short time interval may indicate a positive phase error.

Figure 10:
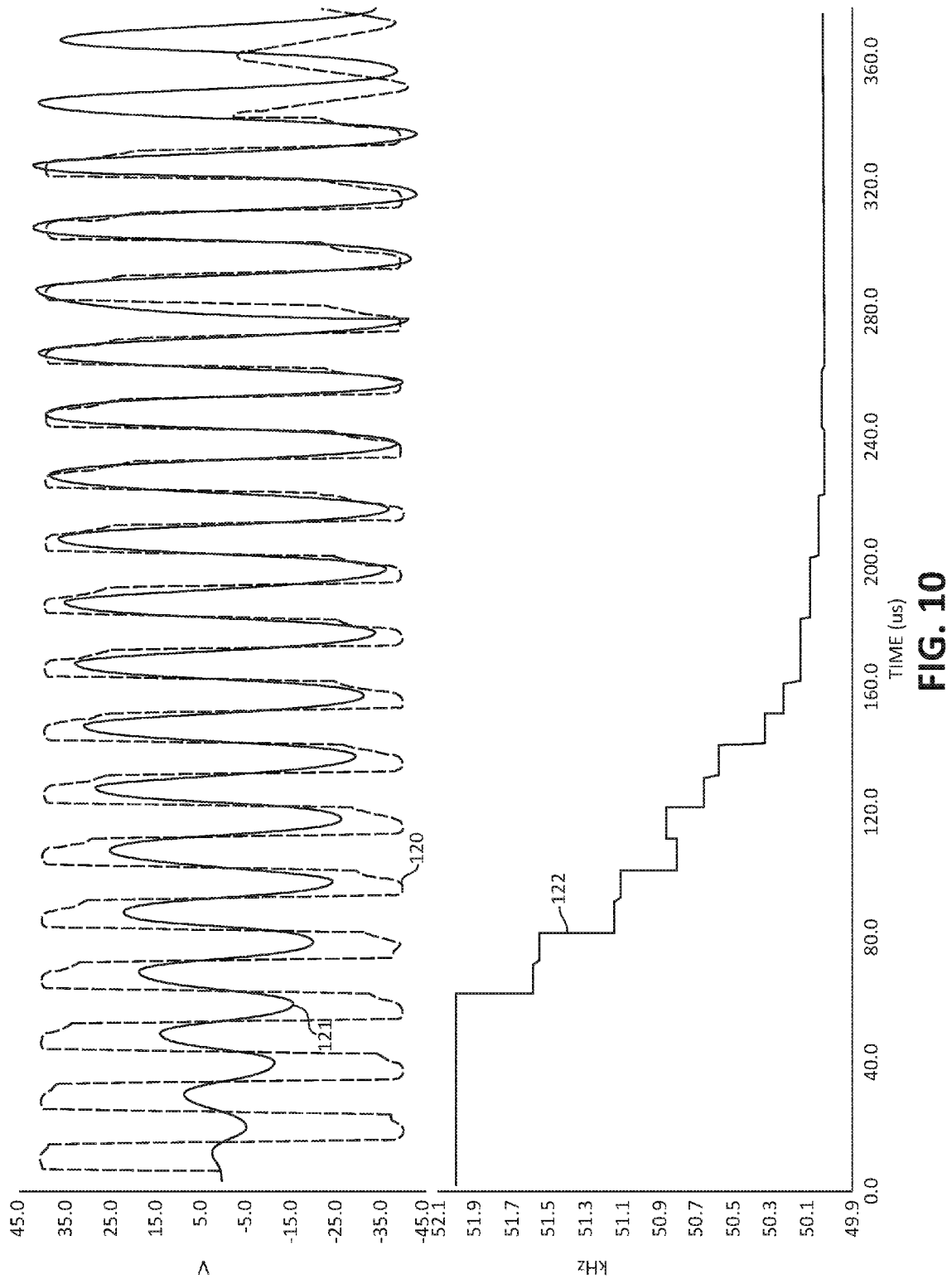
FIG. 10 is a graph illustrating some signals that may be formed by an embodiment of the controller of FIG. 1 in accordance with the present invention.

FIG. 10 is a graph illustrating a non-limiting example of embodiment of some results obtained by using an embodiment of controller 20 and applying an embodiment of the method to adjust the Drive Frequency for an embodiment of transducer 12. A plot 120 illustrates an example of the voltage 25, a plot 121 illustrates an example of the circulating current within transducer 12, and a plot 122 illustrates the Drive Frequency. For the example embodiment, the Drive Frequency starts near fifty two (52) kHz and the actual transducer resonant frequency is approximately fifty (50) kHz. As illustrated by plot 122, the method adjusts the Drive Frequency over a number of drive periods to achieve a Drive Frequency that is approximately equal to the Resonant Frequency.

Figure 11:
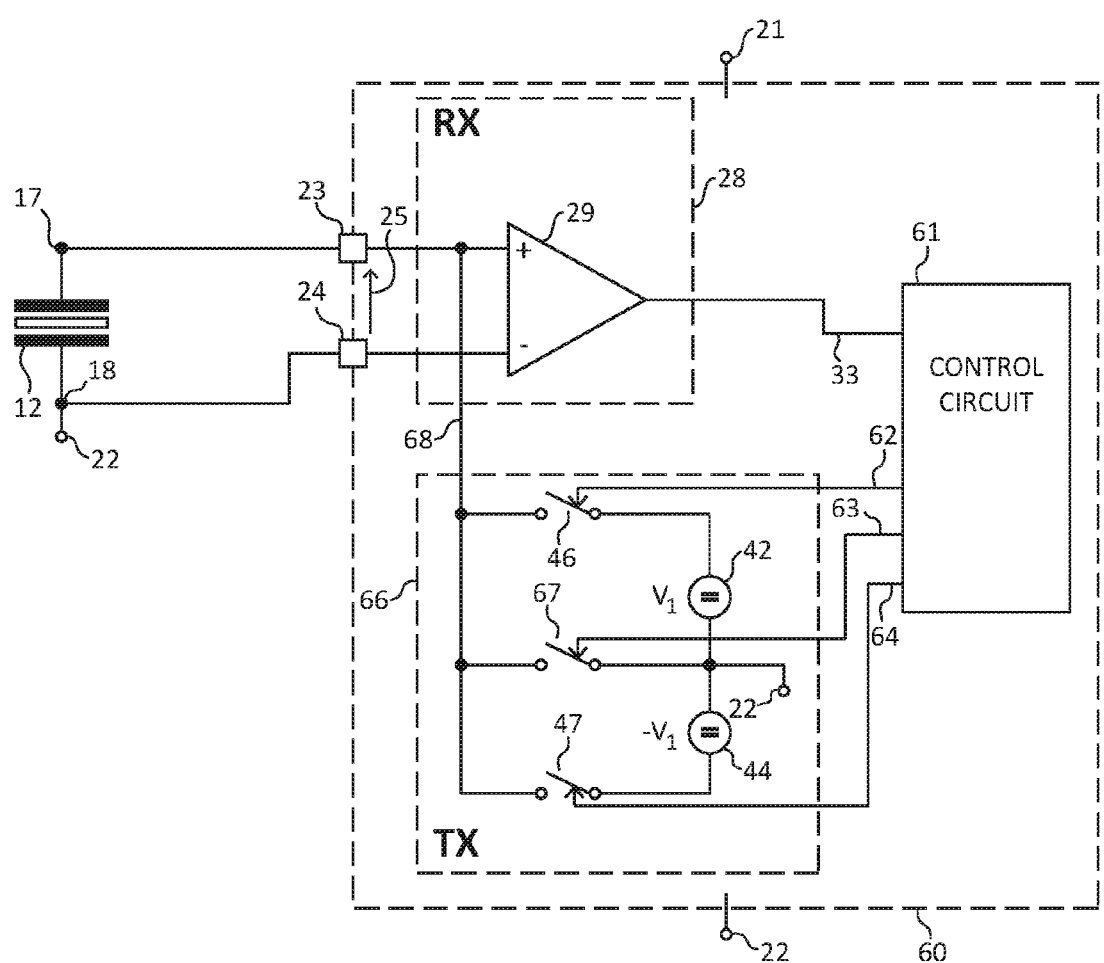
FIG. 11 schematically illustrates an example of an embodiment of a portion of a transducer controller that may be an alternate embodiment of at least a portion of the controller of FIG. 1 in accordance with the present invention.

FIG. 11 schematically illustrates a non-limiting example of embodiment of a portion of a transducer controller 60 that may have an embodiment that is an alternate embodiment of controller 20. An embodiment of controller 60 may be substantially the same as controller 20 except that controller 60 has a drive circuit 66 that may be an alternate embodiment of circuit 41. Controller 60 may be configured to determine the phase error, and adaptively form a drive signal 68 having a frequency and/or phase that is formed responsively to the Resonant Frequency. Controller 60 may be configured to form drive signal 68 having three (3) values or states instead of the two (2) values or states described for drive signal 45 of controller 20 (FIG. 1). Drive circuit 66 includes switches 46, 47, and 67 to form the three (3) values of signal 68.

Figure 12:
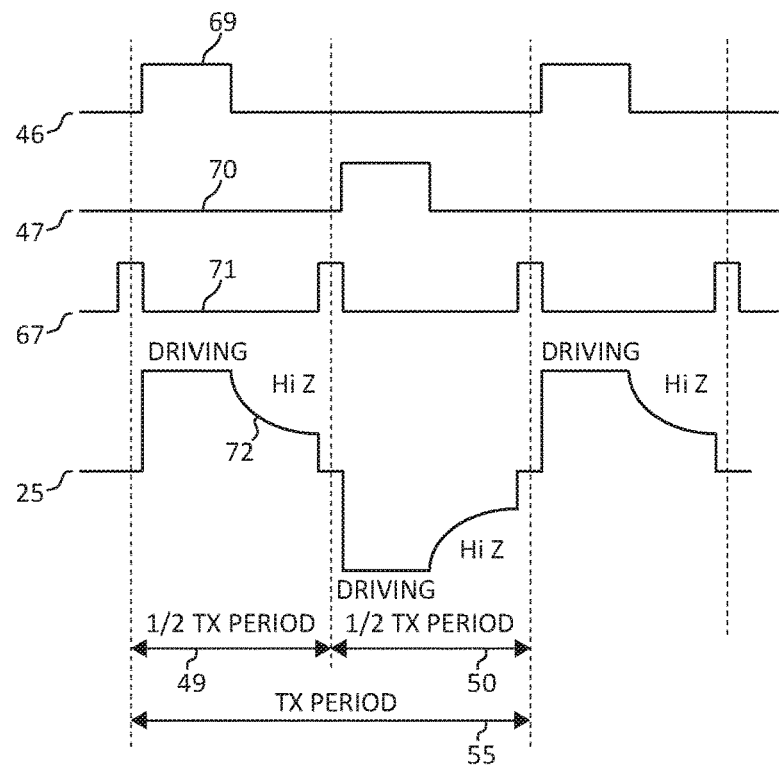
FIG. 12 is a graph illustrating a non-limiting example of an embodiment of some signals resulting from the operation of the controller of FIG. 11 in accordance with the present invention.

FIG. 12 is a graph illustrating a non-limiting example of embodiment of some signals resulting from controller 60 driving transducer 12 and adjusting the frequency of signal 68 to be substantially equal to or close to the Resonant Frequency. A plot 69 illustrates states of switch 46 and a plot 70 illustrates a state of switch 47. A plot 71 illustrates a state of switch 67. A plot 72 illustrates voltage 25. The abscissa indicates time and the ordinate indicates increasing value of the illustrated signals. This description has references to FIGS. 12-13.

Controller 60 operates substantially the same as controller 20 except that for a portion of a drive half-period controller 60 may be configured to enable switch 67 in order to form signal 68 to have a value that is approximately the value of return 22 for a portion of a drive half-period. For example, controller 60 may be configured to enable switch 67 and disable switches 46-47 at the beginning of a half-period or alternately at the end of drive half-period or alternately at any time during a drive half-period. For another portion of a drive half-period controller 60 may be configured to disable switch 67 and enable one of switches 46 or 47 to drive transducer 12 with a voltage for a portion or percentage of the drive half-period. After expiration of the portion or percentage of the drive half-period controller 60 may be configured to disable all of switches 46, 47, and 67 and form a HiZ interval, and determine the phase error as explained in the description of controller 20 and of FIGS. 5-11.

Referring to the graphs and operation explained in the description of FIGS. 5-11, those skilled in the art will appreciate that controller 60 would form similar signals for voltage 25 except that controller 60 would add the zero value of voltage 25 as illustrated in plots 75-77, of FIG. 12.

Figure 13:
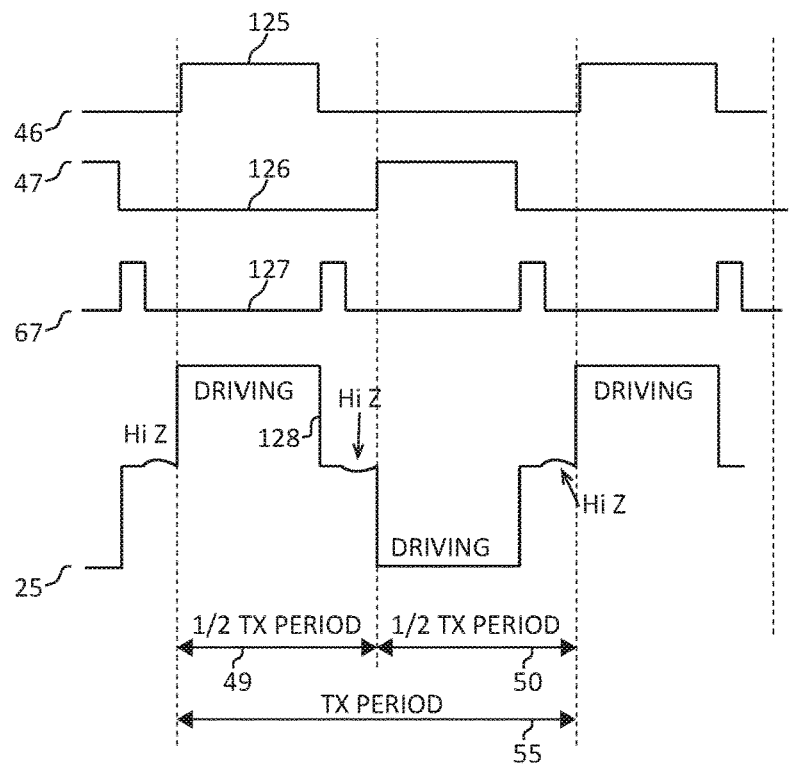
FIG. 13 is a graph illustrating a non-limiting example of an embodiment of some signals resulting from the operation of the controller of FIG. 11 in accordance with the present invention.

FIG. 13 is a graph illustrating a non-limiting example of embodiment of some signals resulting from controller 60 driving transducer 12 and adjusting the frequency of signal 68 to be substantially equal to or close to the Resonant Frequency wherein the HiZ interval is formed immediately after switch 67 is closed or enabled for a time interval. A plot 125 illustrates states of switch 46 and a plot 126 illustrates a state of switch 47. A plot 127 illustrates a state of switch 67. A plot 128 illustrates voltage 25. The abscissa indicates time and the ordinate indicates increasing value of the illustrated signals. This description has references to FIGS. 11-13.

In an example of an embodiment, controller 60 may be configured to enable switch 46 and disable switches 47 and 67 at the beginning portion of a half-period or alternately at the end of drive half-period to drive transducer 12 with a first value, and to subsequently enable switch 47 and disable switches 46 and 67 for a subsequent portion of the half-cycle to drive transducer 12 with a first value. Controller 60 may be configured to subsequently enable switch 67 and disable switches 46-47 to form signal 68 to have a value that is approximately the value of return 22 for another portion of the drive half-period. Controller 60 may have an embodiment configured to form a HiZ interval subsequently to closing switch 67 and determine the phase error or alternately detect the Frequency Difference, as explained in the description of controller 20 and of FIGS. 5-11, for a portion of the HiZ interval.

Referring to the graphs and operation explained in the description of FIGS. 5-11, those skilled in the art will appreciate that controller 60 would form similar signals for voltage 25 during the HiZ interval except that controller 60 would add the zero value of voltage 25 to plots 75-77, as illustrated by plot 128 of FIG. 13.

Figure 14:
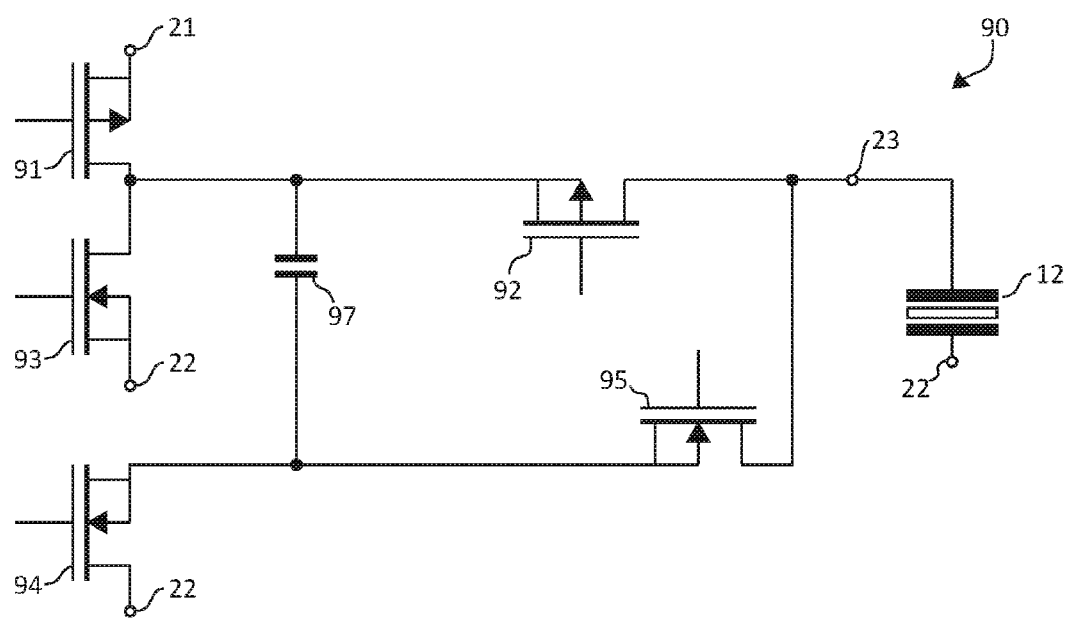
FIG. 14 schematically illustrates an example of a portion of an embodiment of a drive circuit that may be an alternate embodiment of a portion of the controller of FIG. 1 or FIG. 11 in accordance with the present invention.

FIG. 14 schematically illustrates a non-limiting example of embodiment of an example of a portion of an embodiment of a drive circuit 90 that may be an alternate embodiment of drive circuits 41 and/or 66. Circuit 90 includes transistors 91 and 93 that are connected together in a totem pole or series connection. The drive circuit also includes a transistor 94, a transistor 95, and a transistor 92. Transistors 91-92 are P-channel and transistors 93-95 are N-channel transistors. Transistor 91 has a source connected to receive a DC voltage and a drain commonly connected to a drain of transistor 93, a source of transistor 92, and a first terminal of an optional pump capacitor 97. A source of transistor 93 is connected to return 22 which is also connected to a drain of transistor 94. A source of transistor 94 is commonly connected to a source of transistor 95 and to a second terminal of optional capacitor 97. A drain of transistor 92 is commonly connected to a drain of transistor 95 and to terminal 23.

Circuit 90 may have an embodiment that includes a negative charge pump that may include capacitor 97. The charge pump may be configured to generate a negative voltage (−Vi) which may have a magnitude that may be approximately equal to the voltage on input 21 but with an opposite sign (for example a negative sign). Such an embodiment of circuit 90 may be an alternate embodiment of circuit 66 of FIG. 11 because the drive to the approximately zero value or alternately to the value of return 22 is possible.

An embodiment of circuit 90 may include that if transistors 91, 92 and 94 are ON or enabled (all other transistors OFF or disabled), circuit 90 may function similarly to switch 46 (FIG. 11) being enabled or closed and capacitor 97 is charged to approximately the value of input 21. If transistors 93 and 95 are ON or enabled (all other transistors OFF or disabled) and capacitor 97 was charged to the value of input 21, circuit 90 may function similarly to switch 47 being enabled or closed, with an output voltage close to a minus value of the value of input 21. Circuit 90 may include an embodiment that may work similarly to a negative charge pump in addition to functioning as a driver circuit.

If transistors 91 and 94 are ON or enabled (all other transistors OFF) capacitor 97 is charged to approximately the value on input 21, and the output of circuit 90 is in a high impedance state (HiZ).

The circuit may have other embodiments. For example, if transistors 91 and 92 are ON or enabled (all other transistors OFF or disabled), circuit 90 may function similarly to switch 46 (FIG. 11) being closed or enabled without charging capacitor 97. Also, if transistors 94 and 92 are ON or enabled (all other transistors OFF or disabled), and capacitor 97 was charged, circuit 90 may function similarly to switch 46 (FIG. 11) being closed or enabled. If all transistors are OFF, the output of circuit 90 is in a high impedance state (HiZ).

Figure 15:
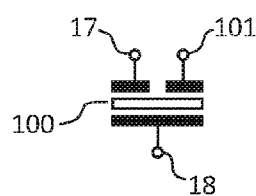
FIG. 15 schematically illustrates an example of a portion of an embodiment of a three-terminal transducer in accordance with the present invention.

FIG. 15 schematically illustrates a non-limiting example of a portion of an embodiment of a three-terminal transducer 100. Transducer 100 may include terminal 17 to which a drive signal may be applied to drive transducer 100 and also may include a sense terminal 101 which may be used to sense or monitor the circulating current within transducer 100.

Figure 16:
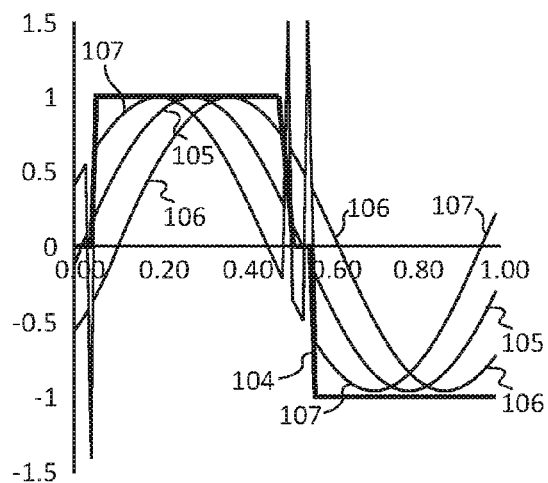
FIG. 16 is a graph illustrating a non-limiting example of an embodiment of some of the signals during an embodiment of a drive period in accordance with the present invention.

FIG. 16 is a graph having plots illustrating a non-limiting example of embodiment of some of the signals during an embodiment of a drive period of signal 45 applied to transducer 100. Transducer 100 may include sense terminal 101 that provides a sense signal for sensing the circulating current. In some embodiments, there may be coupling within transducer 100 between signal 45 and the sense signal. Thus, in some embodiments, controller 20 may be configured to not use values of the sense signal that occur near edges of signal 45. For example, controller 20 may be configured to blank or mask-off values of the sense signal that occur near the edges of signal 45. For example, the sense signal may be ignored or may be blanked for the portions of a half-period within a percent of the transition, for example approximately five to ten percent (5%-10%) of the period around each transition. An embodiment of controller 20 may be configured to form the HiZ interval during a portion of the half-period that is away from the transitions, and to determine the phase error during the HiZ interval.

In another example embodiment of controlling transducer 100, an embodiment of controllers 20 or 60 may be configured to form signal 45 or 68 for substantially the entire drive half-period or for the substantially entire drive period and not form the HiZ interval. Controllers 20 or 60 may be configured to receive or monitor the sense signal for the drive half-period or drive period 55, and blank or mask-off the sense signal near or during transitions of signal 45 or 68. Controllers 20 or 60 may also be configured to detect the Frequency Difference or alternately determine the phase error from the sense signal.

An embodiment may include that controllers 20 or 60 may be configured to use the sense signal to sense the circulating current during a drive signal used to form a transmitted acoustic signal during the transmission phase and/or to sense the circulating current during an active damping phase.

Figure 17:
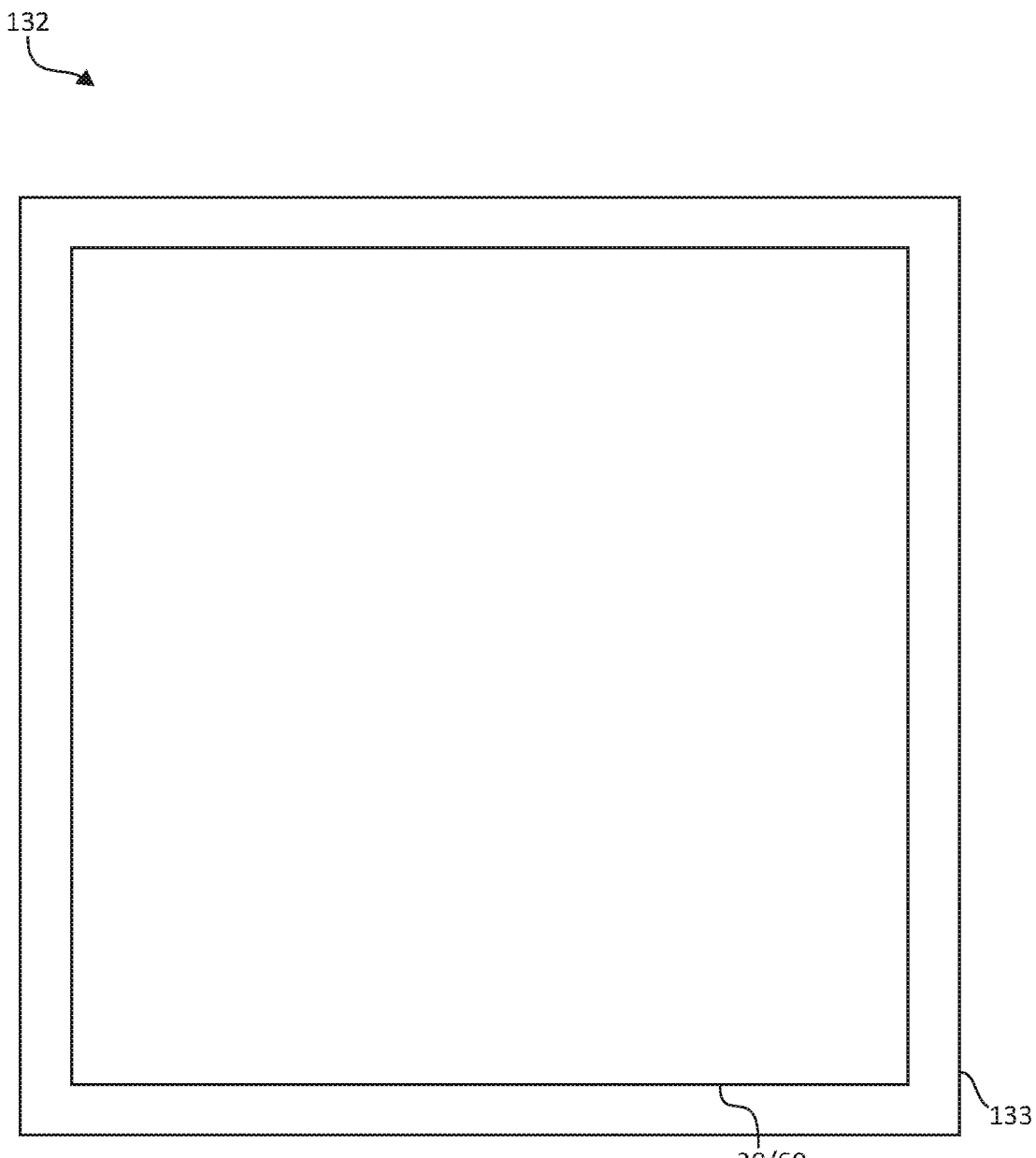
FIG. 17 illustrates an enlarged plan view of a semiconductor device that includes an embodiment of the controller of FIG. 1 or FIG. 11 in accordance with the present invention.

FIG. 17 illustrates an enlarged plan view of a portion of an embodiment of a semiconductor device or integrated circuit 132 that is formed on a semiconductor die 133. In an embodiment, any one of controllers 20 or 60 may be formed on die 133. Die 133 may also include other circuits that are not shown in FIG. 17 for simplicity of the drawing. The controller and device or integrated circuit 132 may be formed on die 133 by semiconductor manufacturing techniques that are well known to those skilled in the art.

From all the foregoing, one skilled in the art will appreciate that an embodiment of a method of forming a transducer controller may comprise:

configuring a transducer controller, such as for example controller 20 or 60, to form a drive signal, such as for example signal 45 or 68, at a first frequency that forms a drive period and a drive half-period;

configuring the transducer controller to drive a transducer with the drive signal for a first portion of a drive half-period;

configuring the transducer controller to sense a reverberation voltage formed by the transducer for a second portion of the drive half-period;

configuring the transducer controller to measure portions of the reverberation voltage and estimate a phase error between the first frequency and a resonant frequency of the transducer; and configuring the transducer controller to adjust the first frequency to a second frequency that reduces the phase error.

Another embodiment of the method may include configuring the transducer controller to adjust the first frequency to the second frequency incrementally for a first number of subsequent drive periods.

The method may have an embodiment that may include configuring the transducer controller to calculate a curvature of a waveform of the voltage and to estimate the phase error from the curvature.

An embodiment may include configuring the transducer controller to adjust the first frequency to the second frequency that is substantially equal to the resonant frequency of the transducer.

Another embodiment may include configuring the transducer controller to form the drive signal to drive the transducer for only the first portion of the drive half-period.

The method have an embodiment that may include configuring the transducer controller to form a HiZ interval during the second half-period and to sense the reverberation voltage during the HiZ interval.

An embodiment may include configuring the transducer controller to measure a value of the reverberation at one or more time intervals during the second half-period and determine a ratio of the one or more values.

An embodiment may include comparing the ratio to a theoretically calculated value and determine a difference between the ratio and the theoretically calculated value and using the difference to determine how far to adjust the first frequency.

An embodiment of the method may include configuring the transducer controller to form the drive signal with a substantially zero value for a third portion of the half-period, wherein the third portion is formed after the first portion and one of prior to the second portion or after the second portion Those skilled in the art will appreciate that an embodiment of a method of forming a transducer controller may comprise:

configuring the transducer controller to form a drive signal at a first frequency that forms a drive period and a drive half-period;

configuring the transducer controller to drive a transducer with the drive signal for a first portion of a drive half-period;

configuring the transducer controller to sense in a second portion of the drive half-period a reverberation signal formed by the transducer in response to the drive signal;

configuring the transducer controller to determine a phase error between the first frequency and a frequency of the reverberation signal; and configuring the transducer controller to adjust the first frequency to a second frequency that reduces the phase error.

An embodiment of the method may include forming the transducer controller to include a non-transitory computer readable medium having a program stored therein.

Another embodiment may include forming the transducer controller to operate according to the program.

An embodiment may include configuring the transducer controller to form an immediately subsequent second period of the drive signal wherein the second period has the second duration.

In an embodiment, the method may include configuring the transducer controller to measure values of the reverberation signal at a plurality of times during the second portion of the drive half-period.

An embodiment of the method may include configuring the transducer controller to form a ratio of two or more of the values and to compare the ratio to a theoretical ratio value.

Another embodiment may include configuring the transducer controller to determine a time for the reverberation signal value to substantially cross a threshold value, and to compare the time to a theoretically determined time.

An embodiment may include configuring the transducer controller to place outputs of the transducer controller in a high impedance state during the second portion of the drive half-period and to sense the reverberation voltage during the high impedance state.

Those skilled in the art will appreciate that an embodiment of a method of forming a transducer controller may comprise:

configuring the transducer controller to form a drive signal at a first frequency that forms a drive period and a drive half-period;

configuring the transducer controller to drive a transducer with the drive signal for a at least first portion of the drive half-period;

configuring the transducer controller to sense in a second portion of the drive half-period a reverberation signal formed by the transducer in response to the drive signal wherein the transducer controller is configured to ignore the reverberation signal responsively to transitions of the drive signal;

configuring the transducer controller to determine a phase error between the first frequency and a frequency of the reverberation signal; and configuring the transducer controller to adjust the first frequency to a second frequency that is closer to a reverberation frequency of the transducer than the first frequency.

An embodiment of the method may include configuring the transducer controller to mask-off the reverberation signal approximately at transitions of the drive signal.

Another embodiment may include forming the second frequency to be substantially equal to the reverberation frequency.

In view of all of the above, it is evident that a novel device and method is disclosed. Included, among other features, is forming a control circuit or controller to periodically detect a difference between the Drive Frequency and the resonant frequency of a transducer (or alternately a difference between a phase of the drive signal and a phase of the transducer resonant frequency) during a cycle of transmitting a measurement signal from the transducer, and to adjust the frequency of the drive signal to reduce a phase error or in an alternate embodiment adjust the frequency of signal 45 to be substantially equal to the transducer 12 resonant frequency during the transmission cycle. Adjusting the frequency of signal 45 during the transmission cycle, for example during a half-period, improves the sensitivity of transducer 12 and facilitates using transducer 12 to measure greater distances. It may also facilitate forming a wider detectable range for which the transducer may be used.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, the example form of the measuring system and related controllers are used as a vehicle to explain the operation method of determining or estimating the phase error and/or detecting the Frequency Difference, and adjusting the Drive Frequency.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a transducer controller comprising:

configuring a transducer controller to form a drive signal at a first frequency that forms a drive period and a drive half-period;

configuring the transducer controller to drive a transducer with the drive signal for a first portion of a drive half-period;

configuring the transducer controller to sense a reverberation voltage formed by the transducer for a second portion of the drive half-period;

configuring the transducer controller to measure portions of the reverberation voltage and estimate a phase error between the first frequency and a resonant frequency of the transducer; and configuring the transducer controller to adjust the first frequency to a second frequency that reduces the phase error.

2. The method of claim 1 wherein configuring the transducer controller to adjust the first frequency includes configuring the transducer controller to adjust the first frequency to the second frequency incrementally for a first number of subsequent drive periods.

3. The method of claim 1 wherein configuring the transducer controller to measure the reverberation voltage includes configuring the transducer controller to calculate a curvature of a waveform of the voltage and to estimate the phase error from the curvature.

4. The method of claim 1 further including configuring the transducer controller to adjust the first frequency to the second frequency that is substantially equal to the resonant frequency of the transducer.

5. The method of claim 1 wherein configuring the transducer controller to drive the transducer includes configuring the transducer controller to form the drive signal to drive the transducer for only the first portion of the drive half-period.

6. The method of claim 1 wherein configuring the transducer controller to sense the reverberation voltage includes configuring the transducer controller to form a HiZ interval during the second half-period and to sense the reverberation voltage during the HiZ interval.

7. The method of claim 1 wherein configuring the transducer controller to estimate the phase error includes configuring the transducer controller to measure a value of the reverberation at one or more time intervals during the second half-period and determine a ratio of the one or more values.

8. The method of claim 7 further including comparing the ratio to a theoretically calculated value and determine a difference between the ratio and the theoretically calculated value and using the difference to determine how far to adjust the first frequency.

9. The method of claim 1 further including configuring the transducer controller to form the drive signal with a substantially zero value for a third portion of the half-period, wherein the third portion is formed after the first portion and one of prior to the second portion or after the second portion.

10. A method of forming a transducer controller comprising:
- configuring the transducer controller to form a drive signal at a first frequency that forms a drive period and a drive half-period;
- configuring the transducer controller to drive a transducer with the drive signal for a first portion of a drive half-period;
- configuring the transducer controller to sense in a second portion of the drive half-period a reverberation signal formed by the transducer in response to the drive signal;
- configuring the transducer controller to determine a phase error between the first frequency and a frequency of the reverberation signal; and
- configuring the transducer controller to adjust the first frequency to a second frequency that reduces the phase error.

11. The method of claim 10 further including forming the transducer controller to include a non-transitory computer readable medium having a program stored therein.

12. The method of claim 11 further including forming the transducer controller to operate according to the program.

13. The method of claim 10 further including configuring the transducer controller to form an immediately subsequent second period of the drive signal wherein the second period has the second duration.

14. The method of claim 10 wherein configuring the transducer controller to determine the phase error includes configuring the transducer controller to measure values of the reverberation signal at a plurality of times during the second portion of the drive half-period.

15. The method of claim 14 further including configuring the transducer controller to form a ratio of two or more of the values and to compare the ratio to a theoretical ratio value.

16. The method of claim 10 wherein configuring the transducer controller to determine the phase error includes configuring the transducer controller to determine a time for the reverberation signal value to substantially cross a threshold value, and to compare the time to a theoretically determined time.

17. The method of claim 10 wherein configuring the transducer controller to sense in a second portion of the drive half-period a reverberation signal includes configuring the transducer controller to place outputs of the transducer controller in a high impedance state during the second portion of the drive half-period and to sense the reverberation voltage during the high impedance state.

18. A method of forming a transducer controller comprising:
- configuring the transducer controller to form a drive signal at a first frequency that forms a drive period and a drive half-period;
- configuring the transducer controller to drive a transducer with the drive signal for a at least first portion of the drive half-period;
- configuring the transducer controller to sense in a second portion of the drive half-period a reverberation signal formed by the transducer in response to the drive signal wherein the transducer controller is configured to ignore the reverberation signal responsively to transitions of the drive signal;
- configuring the transducer controller to determine a phase error between the first frequency and a frequency of the reverberation signal; and
- configuring the transducer controller to adjust the first frequency to a second frequency that is closer to a reverberation frequency of the transducer than the first frequency.

19. The method of claim 18 wherein configuring the transducer controller to sense the reverberation signal includes configuring the transducer controller to mask-off the reverberation signal approximately at transitions of the drive signal.

20. The method of claim 18 including configuring the second frequency to be substantially equal to the reverberation frequency.

* * * * *